(12) United States Patent
Nakamura et al.

(10) Patent No.: US 12,495,510 B2
(45) Date of Patent: Dec. 9, 2025

(54) ELECTRONIC CONTROL DEVICE

(71) Applicant: HITACHI ASTEMO, LTD., Hitachinaka (JP)

(72) Inventors: Yuki Nakamura, Tokyo (JP); Isao Hoda, Tokyo (JP); Masahiro Toyama, Tokyo (JP); Eiji Ichikawa, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 108 days.

(21) Appl. No.: 18/559,127

(22) PCT Filed: Feb. 9, 2022

(86) PCT No.: PCT/JP2022/005219
§ 371 (c)(1),
(2) Date: Nov. 6, 2023

(87) PCT Pub. No.: WO2022/244344
PCT Pub. Date: Nov. 24, 2022

(65) Prior Publication Data
US 2024/0244780 A1 Jul. 18, 2024

(30) Foreign Application Priority Data
May 19, 2021 (JP) .................... 2021-084453

(51) Int. Cl.
H05K 5/04 (2006.01)
H05K 7/14 (2006.01)
(52) U.S. Cl.
CPC ............. H05K 5/04 (2013.01); H05K 7/14 (2013.01)

(58) Field of Classification Search
CPC ............. H05K 5/04; H05K 7/14; H05K 9/00
USPC ........................................ 312/223.1
See application file for complete search history.

(56) References Cited

U.S. PATENT DOCUMENTS 5,975,962 A * 11/1999 Laukonis ............. H01R 13/518
439/713
6,557,385 B1 * 5/2003 Shih .................... H05K 5/0208
70/159
6,751,100 B2 * 6/2004 Chen ..................... G06F 1/181
361/679.02

(Continued)

FOREIGN PATENT DOCUMENTS

JP H01-139492 U 9/1989
JP H05-291967 A 11/1993
(Continued)

OTHER PUBLICATIONS

International Search Report with English Translation and Written Opinion dated Apr. 26, 2022 in corresponding International Application No. PCT/JP2022/005219 (9 pages).

Primary Examiner — Muhammad Ijaz
(74) Attorney, Agent, or Firm — Foley & Lardner LLP

(57) ABSTRACT

An electronic control device includes a circuit board having a plurality of connectors for connection to an external apparatus, and a housing made of a conductive material and adapted to accommodate the circuit board therein. The housing has an opening corresponding to the connectors, and at least one of a first housing component and a second housing component which constitute the housing has a comb-blade-shaped portion for partitioning the opening for each of the connectors.

4 Claims, 3 Drawing Sheets

(56) References Cited

U.S. PATENT DOCUMENTS

| | | | | |
|---|---|---|---|---|
| 7,251,141 B2* | 7/2007 | Masui | ............ | G01T 1/02 |
| | | | | 312/223.1 |
| 7,275,646 B2* | 10/2007 | Mimlitch, III | ......... | H05K 7/186 |
| | | | | 403/167 |
| 9,101,049 B2* | 8/2015 | Hanson | ............ | F24F 13/084 |
| 12,285,103 B2* | 4/2025 | Wang | ............ | A47B 96/068 |
| 2001/0017771 A1* | 8/2001 | Matsumiya | ............ | H05K 5/026 |
| | | | | 361/800 |
| 2002/0171339 A1* | 11/2002 | Masse | ............ | H01R 9/2608 |
| | | | | 312/223.1 |
| 2004/0184227 A1* | 9/2004 | Moffett | ............ | H01R 13/6278 |
| | | | | 361/679.01 |
| 2008/0290767 A1* | 11/2008 | Rimback | ............ | A47B 81/00 |
| | | | | 312/223.1 |
| 2013/0204262 A1* | 8/2013 | Menendez | ............ | A61B 17/02 |
| | | | | 606/89 |
| 2014/0111070 A1* | 4/2014 | Ehlen | ............ | H05K 7/14 |
| | | | | 29/525.01 |
| 2017/0121838 A1* | 5/2017 | Tatebe | ............ | C25D 11/10 |
| 2018/0257336 A1* | 9/2018 | Ito | ............ | C08J 9/365 |
| 2019/0062939 A1* | 2/2019 | Curran | ............ | H05K 5/04 |
| 2019/0237408 A1* | 8/2019 | Katsube | ............ | H05K 9/00 |
| 2021/0185795 A1 | 6/2021 | Toyama et al. | | |
| 2022/0342463 A1* | 10/2022 | Norton | ............ | G06F 1/187 |
| 2022/0408569 A1* | 12/2022 | Toyama | ............ | H05K 7/20172 |
| 2022/0408572 A1* | 12/2022 | Saito | ............ | H01R 13/52 |
| 2024/0244780 A1* | 7/2024 | Nakamura | ............ | H05K 9/00 |
| 2024/0244808 A1* | 7/2024 | Ozaki | ............ | H05K 3/00 |

FOREIGN PATENT DOCUMENTS

| | | |
|---|---|---|
| JP | H07-212074 A | 8/1995 |
| JP | 2008-028160 A | 2/2008 |
| JP | 2018-129441 A | 8/2018 |
| JP | 2019-106404 A | 6/2019 |

* cited by examiner

ELECTRONIC CONTROL DEVICE

TECHNICAL FIELD

The present invention relates to electronic control devices.

BACKGROUND ART

For high-level autonomous driving, there is a need for a large number of external-field recognition sensors for complicated driving operations, for example, for coping with sudden interruption of a vehicle on a general road. Therefore, an automatic driving electronic control unit (ECU) is required to process a large capacity of information transmitted from a large number of external-field recognition sensors at high speeds, in order to cause the driving control to follow the surrounding environment changing from moment to moment. From such a background, communication between external-field recognition sensors and an automatic driving ECU has needed a plurality of channels for communication using frequency bands (GHz bands) higher than conventionally-used frequency bands. This has raised the problem of securing resistance to external electromagnetic noises within the same frequency bands.

As a background art of the present invention, as a technique effective for improving external noise resistance of an electronic apparatus to which a plurality of external apparatuses is connected, Patent Literature 1 cited below discloses a means for improving resistance to external noises using an electromagnetic-wave shield structure for an electronic-apparatus accommodating housing, which includes a housing having an opening for penetrating cables therethrough, and an electromagnetic-wave interception member having a conductive wire structured to have a brush shape and adapted to close the opening.

CITATION LIST

Patent Literature

PTL 1: JP 2008-28160 A

SUMMARY OF INVENTION

Technical Problem

With the technique of Patent Literature 1, the electronic apparatus is accommodated in the housing. Therefore, it is necessary to connect connectors to the electronic apparatus in advance, which makes it difficult to insert and remove the connectors without opening and closing the electronic-apparatus accommodating housing having the electromagnetic-wave shield structure. Furthermore, in order to protect the electronic apparatus from external noises, it is necessary to introduce the shielding housing separately from the electronic apparatus, which may increase the cost. In view of this fact, it is an object of the present invention to provide an electronic control device having a lower cost and improved noise resistance.

Solution to Problem

An electronic control device according to the present invention includes a circuit board having a plurality of connectors for connection to an external apparatus, and a housing made of a conductive material and adapted to accommodate the circuit board therein, in which the housing has an opening corresponding to the connectors, and at least one of a first housing component and a second housing component which constitute the housing has a comb-blade-shaped portion for partitioning the opening for each of the plurality of connectors.

Advantageous Effects of Invention

According to the present invention, it is possible to provide an electronic control device having a lower cost and improved noise resistance.

Figure 1:
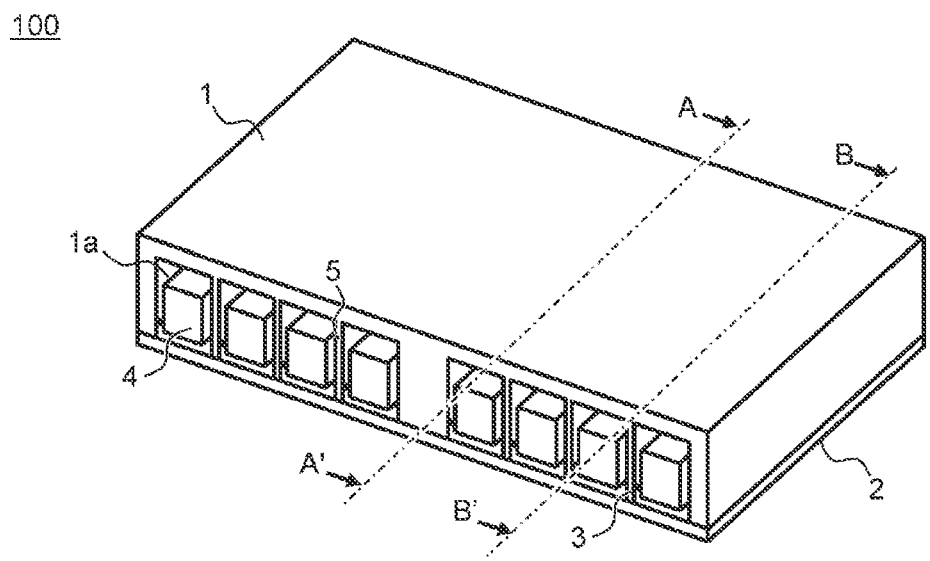
FIG. 1 is an external perspective view of a first embodiment of an electronic control device according to the present invention.

Hereinafter, embodiments of the present invention will be described with reference to the drawings. The following description and drawings are merely examples for explaining the present invention, and omission and simplification are made thereto appropriately for the sake of clarification of explanation. The present invention can be also implemented in other various aspects. Unless otherwise specified, as each constituent component, it is possible to provide one or a plurality of such constituent components.

In the drawings, the position, the size, the shape, the range and the like of each constituent component illustrated therein may not represent its actual position, size, shape, range and the like, in order to facilitate understanding of the invention, in some cases. Therefore, the present invention is not necessarily limited to the positions, sizes, shapes, ranges and the like disclosed in the drawings.

A FIRST EMBODIMENT OF THE PRESENT INVENTION AND THE OVERALL STRUCTURE OF A DEVICE INCLUDING THE SAME

Figure 2:
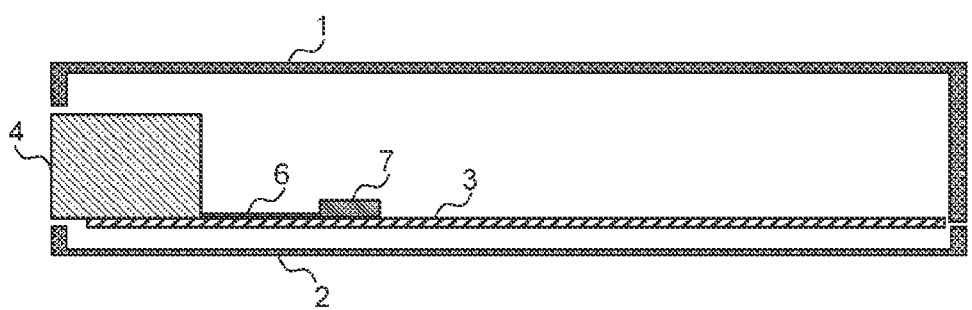
FIG. 2 is a cross-sectional view of the electronic control device illustrated in FIG. 1, taken along a line A-A'.
Figure 3:
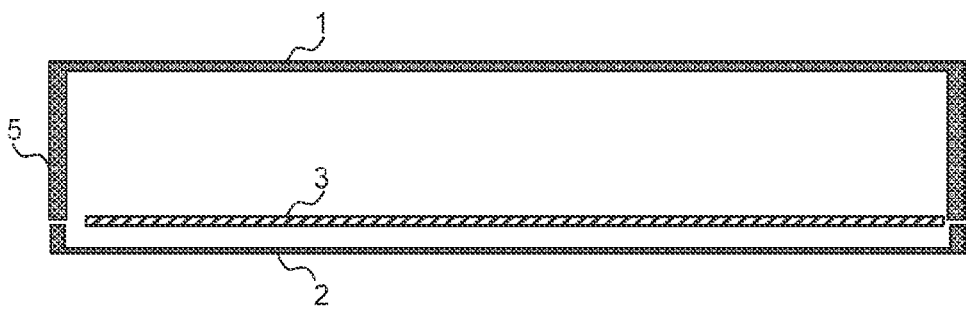
FIG. 3 is a cross-sectional view of the electronic control device illustrated in FIG. 1, taken along a line B-B'.

FIG. 1 is an external perspective view of a first embodiment of an electronic control device according to the present invention, and FIG. 2 is a cross-sectional view of the electronic control device illustrated in FIG. 1, taken along a line A-A'. FIG. 3 is a cross-sectional view of the electronic control device illustrated in FIG. 1, taken along a line B-B'.

The electronic control device 100 in FIG. 1 has an upper housing 1 and a lower housing 2. The housings 1 and 2 are made of a metal material such as aluminum, from the viewpoint of securing electromagnetic shielding performance. Also, the housings 1 and 2 can be made of a plate metal material formed from iron, a non-metallic material capable of securing shielding performance such as a conductive resin material, or the like, which enables reduction of the cost and the weight.

The housings 1 and 2 interiorly accommodate a circuit board 3 on which a plurality of external-apparatus connecting connectors 4 is mounted, and the housings 1 and 2 are provided with an opening 1a at their portions at which the external-apparatus connecting connectors 4 are mounted. The housing 1 has a comb-blade-shaped shield structure 5 (a comb-blade-shaped portion) which partitions the opening 1a for each of the connectors 4. Incidentally, instead of the housing 1, the housing 2 may be provided with the shield structure 5. Also, both the housing 1 and the housing 2 may be provided with respective shield structures 5, and these respective shield structures 5 may butt against each other at their tip ends to form an opening 1a. In FIG. 2, a signal wiring 6 connects an external-apparatus connecting connector 4 to an IC 7.

An in-vehicle electronic apparatus including the electronic control device 100 performs a plurality of noise resistance tests, in order to ensure noise resistance at the time of shipment. These tests include a test for directly irradiating cables or the electronic apparatus main body with a continuous narrow-band noise (an electric field) and evaluating an operation state or a communication state of the electronic apparatus at that time. Incidentally, coaxial cables are employed as the cables for attaining high-speed transmission, which eliminates the necessity for reducing the wiring space and the weight and the necessity for performing skew compensation (compensation for time differences between a plurality of signals), as compared with other transmission methods such as differential transmission.

If the electronic control device 100 is now irradiated with a noise, the noise enters the inside of the housing mainly through the opening 1a where the external-apparatus connecting connectors 4 are disposed. Next, the noise having entered the inside of the housing is directly coupled to the external-apparatus connecting connectors 4, the signal wiring 6, and the IC 7, and induces a noise voltage in each of these elements. If the noise voltage exceeds an allowable value in the IC 7, this inhibits signal transmission. Therefore, it is important to reduce external noises in the opening 1a of the housing.

As an effective means for reducing noises in the opening 1a, there is division of the opening 1a. In general, it is known that a shielding effect of the same total opening area is enhanced by dividing it into a large number of openings 1a. As a typical example, a large number of products have employed metal meshes provided on ventilation openings for heat dissipation.

Further, conventionally, when $\lambda/2$ and $\lambda/4$ of a noise ($\lambda$ is a wavelength of the noise) entering the inside of the housing are close to the lengths of a longer side and a shorter side of the housing opening 1a, the noise resonates in the opening 1a, which may form a new radiation source. However, as in the present embodiment, by dividing the opening 1a, it is possible to shift the resonance frequency in the opening 1a toward a higher frequency side, which can suppress resonance.

Figure 9:
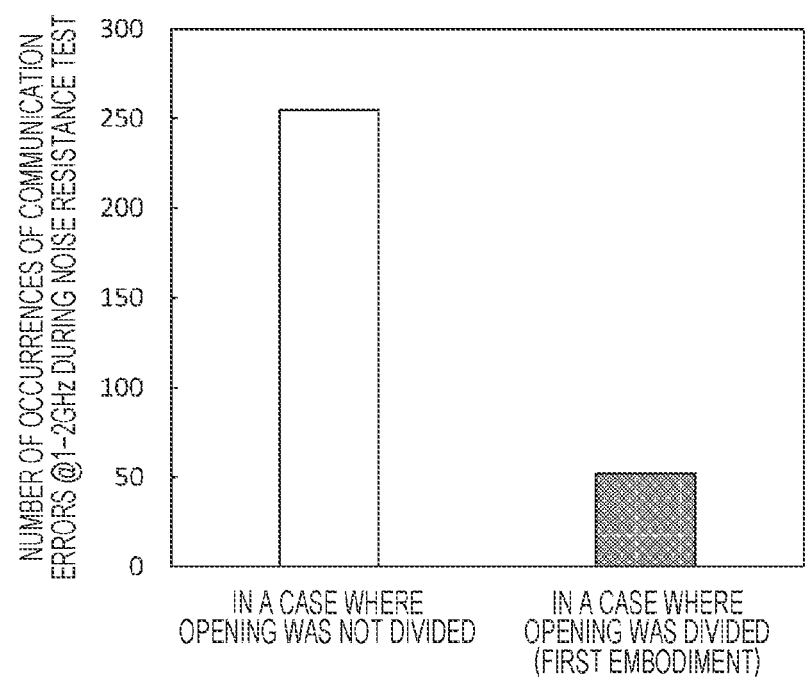
FIG. 9 is a graph illustrating an effect of reducing the rate of occurrences of communication errors according to the present invention at the time of noise tolerance tests.

Further, the opening 1a is reduced in opening area by the comb-blade-shaped shield structure 5, thereby reducing the amount of noise entering the inside of the housing. This makes it possible to enhance the shielding effect with low cost. The shielding effect according to the present embodiment is illustrated in a graph of FIG. 9. Referring to FIG. 9, noise resistance tests (electric-field irradiation tests) were performed, by preparing an electronic control device 100 provided with a plurality of external-apparatus connecting connectors 4. Comparison of the number of occurrences of high-speed communication errors at that time is made, between a case where the housing opening 1a was divided and a case where it was not divided. As illustrated in FIG. 9, according to the present invention, the number of occurrences of communication errors was reduced.

Hereinafter, there will be described second to fifth embodiments, which can be implemented in combination with the first embodiment to enhance the shielding effect of the opening 1a as compared with the case of implementing the first embodiment solely.

SECOND EMBODIMENT

Figure 4:
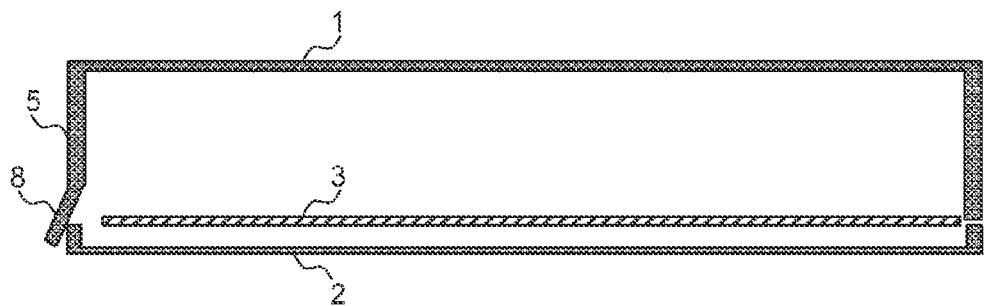
FIG. 4 is a second embodiment of an electronic control device according to the present invention.

FIG. 4 illustrates the second embodiment where a housing-integrated shield structure 5 is partially deformed, along the B-B' cross section in FIG. 1.

In the present embodiment, an upper housing 1 has a bent portion 8 provided by bending a part of the housing-integrated shield structure 5. Accordingly, when the upper housing 1 and a lower housing 2 have been assembled, the shield structure 5 functions as a plate spring against the lower housing 2 at the connection portion. Further, the upper housing 1 is in electrical contact with the lower housing 2 through the bent portion 8.

As compared with the first embodiment where both the upper and lower housings are not in electrical contact with each other, the shielding performance is enhanced by about 10% to 20%, which enables reduction of the number of occurrences of communication errors due to external electromagnetic noises. In principle, when a potential difference is generated between two different metals, an electric field (which has the same meaning as a noise in this case) exists between the metals. However, if both the metals are brought into electrical contact with each other, these metals come to be at the same potential, which causes a state where no electric field exists therebetween. Based on this principle, by bringing the bent portion 8 and the lower housing 2 into contact with each other and, further, grounding the comb-blade-shaped shield structure 5 for causing the bent portion 8 and the lower housing 2 to be at the same potential, it is possible to enhance the shielding performance of the opening 1a, thereby improving the noise resistance.

Incidentally, the shield structure 5 can be also provided in the lower housing 2 rather than in the upper housing 1, which can also provide a similar effect, since the shield structure 5 has the bent portion 8. Further, respective shield structure 5 can be also provided in the upper housing 1 and in the lower housing 2, which can also provide a similar effect, since the shield structure 5 in either one of these housings has the bent portion 8.

THIRD EMBODIMENT

Figure 5:
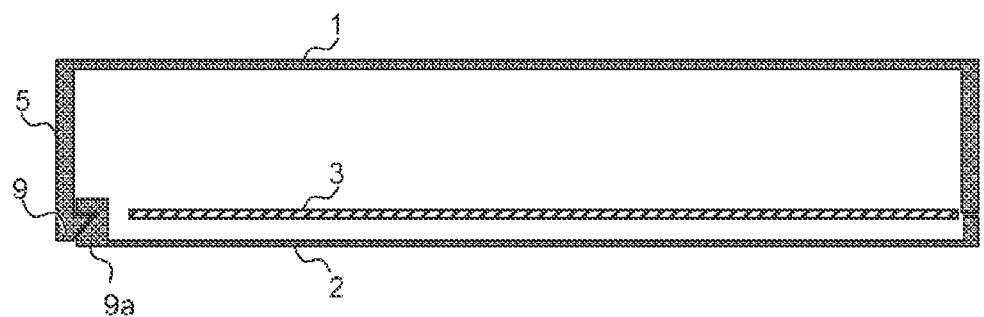
FIG. 5 is a third embodiment of an electronic control device according to the present invention.

FIG. 5 illustrates the third embodiment where a housing-integrated shield structure 5 and a lower housing 2 are partially deformed, along the B-B' line cross section in FIG. 1.

In the present embodiment, the housing-integrated shield structure 5 is partially provided with a hook-shaped portion 9, such that the hook portion at the tip end of the hook-shaped portion 9 is hooked on a hook-shaped-portion receiving portion 9a in the lower housing 2. When the upper housing 1 and the lower housing 2 have been assembled, the hook-shaped portion 9 is hooked on the hook-shaped-portion receiving portion 9a so that these portions are engaged with each other, which causes the upper housing 1 and the lower housing 2 to be electrically connected to each other. This can enhance the shielding performance of the opening 1a, similarly to in the second embodiment.

Incidentally, the hook-shaped portion 9 can be provided in the lower housing 2 rather than in the upper housing 1, and the hook-shaped-portion receiving portion 9a can be provided in the upper housing 1, which can also provide a similar effect. Further, the upper housing 1 and the lower housing 2 can be provided with respective shield structures 5, such that either one of the shield structures 5 can be made to have a hook-shaped portion 9 at its tip end, and the other one of them can be made to have a hook-shaped-portion receiving portion 9a at its tip end. In this case, it is also possible to provide a similar effect.

FOURTH EMBODIMENT

Figure 6:
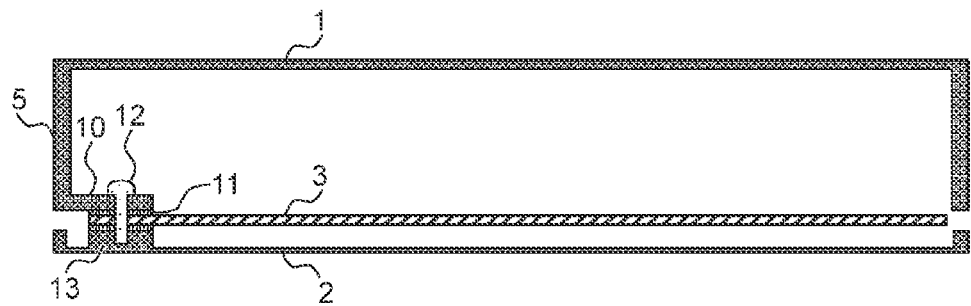
FIG. 6 is a fourth embodiment of an electronic control device according to the present invention.

FIG. 6 illustrates the fourth embodiment where a housing-integrated shield structure 5 and a lower housing 2 are partially deformed, along the B-B' line cross section in FIG. 1.

FIG. 6 is an embodiment on the premise that a circuit board 3 has a GND pattern 11 on a surface layer and a lowermost layer therein, wherein the housing-integrated shield structure 5 is partially folded in shape in the direction toward the inside of the housing to form a folded portion 10. The folded portion 10 is provided with a screw hole, and a screw 12 is inserted therethrough to penetrate the folded portion 10 and the GND pattern 11 to reach a screw securing portion 13, thereby securing the housings 1 and 2 and the board 3 to each other through the screw. Consequently, the upper housing 1 and the lower housing 2 are electrically connected to the GND pattern 11 through the screw 12.

Incidentally, the screw securing portion 13 having a threaded hole is for further enhancing the shielding performance. This brings the lower housing 2 and the GND pattern 11 into contact with each other. However, instead thereof, it is also possible to employ securing with a component which does not change the shape of the lower housing 2, such as a bolt. In the present embodiment, the upper housing 1 and the GND 11 are connected to each other by screwing, to cause both of them to be at the same potential, which can enhance the shielding performance.

FIFTH EMBODIMENT

Figure 7:
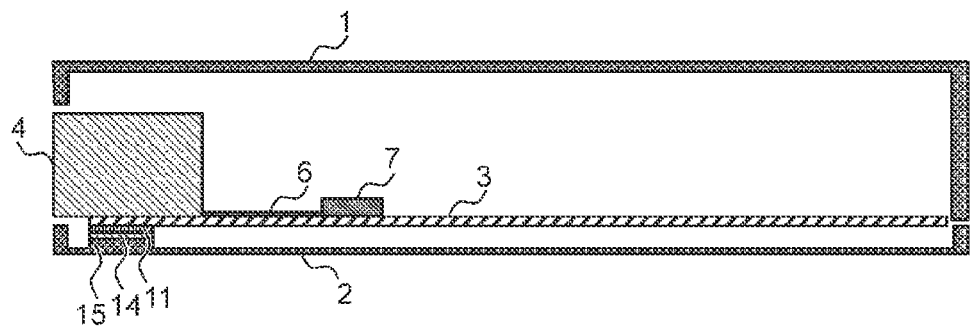
FIG. 7 is an A-A' cross sectional view of a fifth embodiment of an electronic control device according to the present invention.
Figure 8:
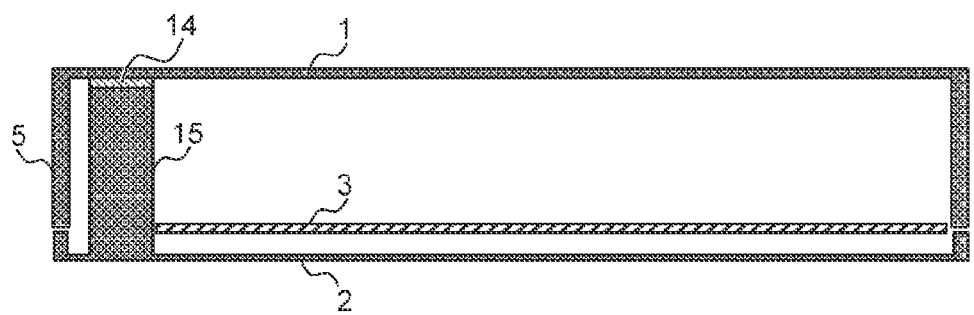
FIG. 8 is a B-B' cross sectional view of the fifth embodiment of the electronic control device according to the present invention.

FIG. 7 and FIG. 8 illustrate the fifth embodiment where a lower housing 2 is partially deformed, along the A-A' line cross section in FIG. 1 and along the B-B' line cross section in FIG. 1, respectively.

In the present embodiment, the lower housing 2 is provided with a housing protruding portion 15, which is connected to a GND pattern 11 or an upper housing 1, and a dielectric material 14 (a heat dissipation grease, a formed in place gasket (FIPG), or the like) is inserted therebetween. Further, the protruding portion 15 protrudes from the lower housing 2 toward the upper housing 1, thereby dividing the inside of the housing.

In addition to the division of the housing opening 1a by the housing-integrated shield structure 5 as described in the first embodiment, the space inside the housing is also divided and, further, the lower housing 2 and the board GND 11 are electrically connected to each other, and the lower housing 2 and the upper housing 1 are electrically connected to each other (contacted each other in an alternating-current manner through the dielectric material 14), as in the present embodiment. This makes it possible to eliminate the potential difference between the upper housing 1 and the lower housing 2 (the same role as that of a capacitor), and it is possible to reduce the housing opening area to improve the noise resistance, thereby enhancing the shielding performance of the opening 1a.

Further, in cases of implementing the present embodiment in combination with the fourth embodiment, metal scraps may be generated at the contact point between the bent portion 8 and the lower housing 2 during vibrations of the housing. However, it is possible to provide a secondary effect of suppressing intrusion of such metal scraps into the inside of the housing by the protruding portion 15.

Incidentally, in the present embodiment, the metals are brought into electrical contact with each other through the dielectric material 14. However, in consideration of the cost and design restrictions, these metals may be brought into direct contact with each other by removing the dielectric material 14. Further, in FIG. 8, the dielectric material 14 may be also provided on the lower housing 2 rather than on the upper housing 1.

According to the aforementioned embodiments of the present invention, it is possible to provide the following effects and advantages.

(1) An electronic control device 100 includes a circuit board 3 having a plurality of connectors 4 for connection to an external apparatus, and a housing made of a conductive material and adapted to accommodate the circuit board 3 therein. The housing has an opening 1a corresponding to the connectors 4, and at least one of a first housing component 1 and a second housing component 2 which constitute the housing has a comb-blade-shaped portion 5 for partitioning the opening 1a for each of the plurality of connectors 4. This makes it possible to provide the electronic control device 100 having a reduced cost and improved noise resistance.

(2) The comb-blade-shaped portion 5 in one of the first housing component 1 and the second housing component 2 is bent at its tip end, and the first housing component 1 and the second housing component 2 are in electrical contact with each other through the bent portion 8. This makes it possible to cause the first housing component 1 and the second housing component 2 to be at the same potential, which can enhance the shielding performance of the opening 1a, thereby improving the noise resistance.

(3) The comb-blade-shaped portion 5 in one of the first housing component 1 and the second housing component 2 has a hook-shaped portion 9 formed to have a hook shape at its tip end, the other of the first housing component 1 and the second housing component 2 has a hook-shape receiving portion 9a corresponding to the hook-shaped portion 9, and the first housing component 1 and the second housing component 2 are electrically connected to each other through engagement between the hook-shaped portion 9 and the hook-shaped-portion receiving portion 9a. This makes it possible to enhance the shielding performance of the opening 1a.

(4) The comb-blade-shaped portion 5 in one of the first housing component 1 and the second housing component 2 is folded back at its tip end in the direction toward the inside of the housing to have a folded portion 10, the folded portion 10 is in contact with a GND pattern on the circuit board 3 by securing through a screw, and the first housing component 1 and the second housing component 2 are electrically connected to the GND pattern through the screw 12. This makes it possible to connect the upper housing 1 and the GND 11 to each other to cause both of them to be at the same potential, which can enhance the shielding performance.

(5) Either one of the first housing component 1 and the second housing component 2 has a protruding portion 15 protruding toward the other housing component, and the protruding portion 15 is electrically connected to a GND pattern on the circuit board 3 and to the other housing component with a dielectric material 14 interposed therebetween. This makes it possible to eliminate the potential difference between the upper housing 1 and the lower housing 2, and it is possible to reduce the housing opening area to improve the noise resistance, thereby enhancing the shielding performance of the opening 1a.

Incidentally, the present invention is not limited to the aforementioned embodiments, and various modifications and other structures can be combined therewith without departing from the gist of the present invention. Further, the present invention is not limited to structures including all the structures described in the aforementioned embodiments, and also includes structures provided by eliminating some of these structures.

REFERENCE SIGNS LIST

100 electronic control device
1 upper housing
1a opening
2 lower housing
3 circuit board
4 external-apparatus connecting connector
5 housing-integrated shield structure (comb-blade-shaped portion)
6 signal wiring
7 IC
8 bent portion of housing-integrated shield structure
9 hook-shaped portion of housing-integrated shield structure
9a hook-shaped-portion receiving portion
10 folded portion of housing-integrated shield structure
11 GND pattern on circuit board
12 screw
13 screw securing portion
14 dielectric material
15 housing protruding portion

The invention claimed is:

1. An electronic control device comprising:
a circuit board having a plurality of connectors for connection to an external apparatus; and
a housing made of a conductive material and adapted to accommodate the circuit board therein, wherein
the housing has an opening corresponding to the connectors,
at least one of a first housing component and a second housing component which constitute the housing has a comb-blade-shaped portion for partitioning the opening for each of the plurality of connectors,
wherein
the comb-blade-shaped portion in one of the first housing component and the second housing component has a hook-shaped portion formed to have a hook shape at its tip end,
another of the first housing component and the second housing component has a hook-shape receiving portion corresponding to the hook-shaped portion, and
the first housing component and the second housing component are electrically connected to each other through engagement between the hook-shaped portion and the hook-shaped portion receiving portion.

2. The electronic control device according to claim 1, wherein
the comb-blade-shaped portion in one of the first housing component and the second housing component is bent at its tip end, and
the first housing component and the second housing component are in electrical contact with each other through the bent portion.

3. An electronic control device comprising:
a circuit board having a plurality of connectors for connection to an external apparatus; and
a housing made of a conductive material and adapted to accommodate the circuit board therein, wherein
the housing has an opening corresponding to the connectors,
at least one of a first housing component and a second housing component which constitute the housing has a comb-blade-shaped portion for partitioning the opening for each of the plurality of connectors,
wherein
the comb-blade-shaped portion in one of the first housing component and the second housing component is folded back at its tip end in a direction toward an inside of the housing to have a folded portion,
the folded portion is in contact with a GND pattern on the circuit board by securing through a screw, and
the first housing component and the second housing component are electrically connected to the GND pattern through the screw.

4. An electronic control device comprising:
a circuit board having a plurality of connectors for connection to an external apparatus; and
a housing made of a conductive material and adapted to accommodate the circuit board therein, wherein
the housing has an opening corresponding to the connectors,
at least one of a first housing component and a second housing component which constitute the housing has a comb-blade-shaped portion for partitioning the opening for each of the plurality of connectors,
wherein
either one of the first housing component and the second housing component has a protruding portion protruding toward another housing component, and
the protruding portion is electrically connected to a GND pattern on the circuit board and to the other housing component with a dielectric material interposed therebetween.

* * * * *